(12) United States Patent
Lin

(10) Patent No.: US 9,887,258 B2
(45) Date of Patent: Feb. 6, 2018

(54) METHOD FOR FABRICATING CAPACITOR

(71) Applicant: ASUSTek COMPUTER INC., Taipei (TW)

(72) Inventor: Bin-Yi Lin, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 15/200,001

(22) Filed: Jul. 1, 2016

(65) Prior Publication Data
US 2017/0005161 A1    Jan. 5, 2017

(30) Foreign Application Priority Data
Jul. 3, 2015    (CN) .......................... 2015 1 0386903

(51) Int. Cl.
*H01L 49/02* (2006.01)
*H01G 4/33* (2006.01)
*H01G 4/12* (2006.01)

(52) U.S. Cl.
CPC .............. *H01L 28/92* (2013.01); *H01G 4/12* (2013.01); *H01G 4/33* (2013.01); *H01L 28/55* (2013.01)

(58) Field of Classification Search
USPC ........................................................ 438/398
See application file for complete search history.

(56) References Cited

U.S. PATENT DOCUMENTS

| 5,621,606 | A | 4/1997 | Hwang |
| 2003/0104638 | A1 | 6/2003 | Kim et al. |
| 2003/0124794 | A1 | 7/2003 | Girardie |
| 2004/0217445 | A1* | 11/2004 | Sakashita ............... C04B 35/475 257/534 |
| 2005/0170599 | A1* | 8/2005 | Joo ......................... H01L 28/91 438/396 |
| 2006/0113580 | A1* | 6/2006 | Cho ................... H01L 27/10852 257/306 |
| 2007/0108493 | A1* | 5/2007 | Iijima ............... H01L 27/10852 257/308 |

(Continued)

FOREIGN PATENT DOCUMENTS

| CN | 102024564 | 4/2011 |
| CN | 102262939 | 11/2011 |

(Continued)

*Primary Examiner* — Zandra Smith
*Assistant Examiner* — Lawrence Tynes, Jr.
(74) *Attorney, Agent, or Firm* — JCIPRNET

(57) ABSTRACT

A method for fabricating a capacitor includes following steps: providing a substrate and a first conducting material layer which is disposed on the substrate; removing a part of the first conducting material layer to expose a part of the substrate to form a plurality of first inner electrodes, wherein the first inner electrodes are arranged along a first direction, and the adjacent first inner electrodes have an interval therebetween; forming a dielectric layer along a second direction by a chemical vapor deposition process, wherein the first direction is perpendicular to the second direction so that the dielectric layer covers the first inner electrodes and the exposed part of the substrate, and the dielectric layer does not fully fill the intervals; and forming a second conducting material layer to fill the intervals that are not fully filled by the dielectric layer to form a plurality of second inner electrodes.

10 Claims, 3 Drawing Sheets

(56) References Cited

U.S. PATENT DOCUMENTS

| | | | |
|---|---|---|---|
| 2007/0296010 A1* | 12/2007 | Su | H01L 21/743 257/301 |
| 2011/0146400 A1* | 6/2011 | Humbert | G01N 27/223 73/335.04 |
| 2011/0294073 A1 | 12/2011 | Shin et al. | |
| 2015/0287534 A1* | 10/2015 | Masuda | H01G 4/10 361/301.4 |
| 2017/0084613 A1* | 3/2017 | Hwang | H01L 27/10808 |

FOREIGN PATENT DOCUMENTS

| | | |
|---|---|---|
| TW | 538528 | 6/2003 |
| TW | 200845232 | 11/2008 |

* cited by examiner

US 9,887,258 B2

METHOD FOR FABRICATING CAPACITOR

CROSS-REFERENCE TO RELATED APPLICATION

This application claims the priority benefit of China application serial No. 201510386903.2, filed on Jul. 3, 2015. The entirety of the above-mentioned patent application is hereby incorporated by reference herein and made a part of this specification.

BACKGROUND OF THE INVENTION

Field of the Invention

The invention relates to a method for fabricating a semiconductor element and, more specifically, to a method for fabricating a capacitor.

Description of the Related Art

Conventionally, a multi-layer ceramic capacitor (MLCC) or a super capacitor (SC) (which is also called as electrical double layer capacitor (EDLC)) is used, for example, as an input capacitor, in a power supply circuit of a central processing unit (CPU) in a personal computer or a notebook to reduce the cost and the volume of the element. However, the volume of a common MLCC or SC is large. And also, the MLCC or SC only can be used under a limited environmental temperature range. In addition, the MLCC or SC cannot be used at a low environmental temperature (for example, below minus 40 degrees) or a high environmental temperature (for example, above 70 degrees).

BRIEF SUMMARY OF THE INVENTION

According to an aspect of the present disclosure, a method for fabricating a capacitor comprises: providing a substrate and a first conducting material layer, wherein the first conducting material layer is disposed on the substrate; removing a part of the first conducting material layer to expose a part of the substrate to form a plurality of first inner electrodes, wherein the first inner electrodes are arranged along a first direction, and the adjacent first inner electrodes have an interval therebetween; forming a dielectric layer along a second direction by a chemical vapor deposition process, wherein the first direction is perpendicular to the second direction so that the dielectric layer covers the first inner electrodes and part of the intervals, and exposed part of the substrate; and forming a second conducting material layer to fill the intervals that are not fully filled by the dielectric layer to form a plurality of second inner electrodes.

In sum, according to the method for fabricating the capacitor, the dielectric layer is formed by a chemical vapor deposition such as an atomic layer deposition process which results in thin and uniform thickness. Thus, the capacitor is thin in size and has a quick charge characteristic. Furthermore, in embodiments, since the first inner electrodes and the second inner electrodes of the capacitor are formed of nitride or metal, the dielectric layer is formed by stacking the barium titanate, the strontium titanate or the barium strontium titanium and the first external electrodes and the second external electrodes are formed of metal, the capacitor can be used at a wider environmental temperature range and survive under a rigorous temperature condition.

BRIEF DESCRIPTION OF THE DRAWINGS

These and other features, aspects and advantages of the invention will become better understood with regard to the following embodiments and accompanying drawings.

DETAILED DESCRIPTION OF THE EMBODIMENTS

Figure 1:
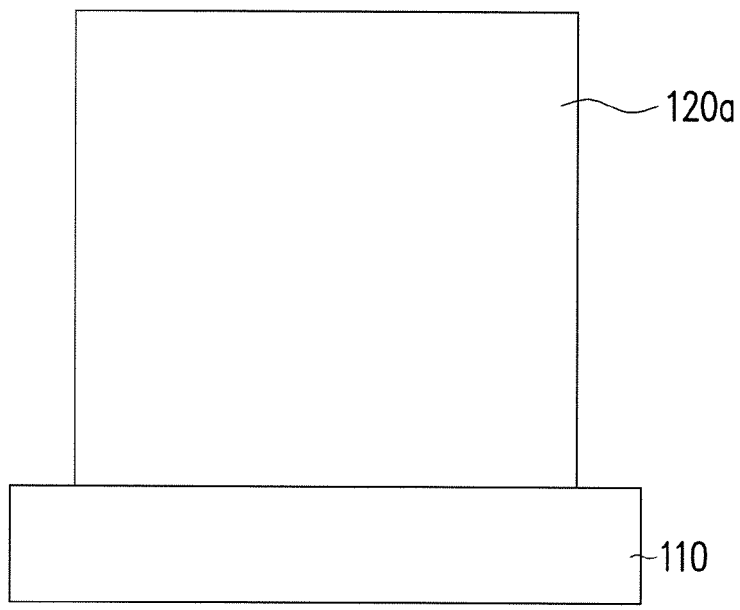
FIG. 1 to FIG. 5 are section views of intermediate structures in manufacturing a capacitor in an embodiment.

FIG. 1 to FIG. 5 are section views of intermediate structures in manufacturing a capacitor in an embodiment. Referring to FIG. 1, a substrate 110 and a first conducting material layer 120a are provided. The first conducting material layer 120a is formed on the substrate 110. In the embodiment, the substrate 110 is formed of metal (such as, copper, silver and aluminum), and the substrate 110 is used as the first external electrode. In the embodiment, the first conducting material layer 120a is formed of nitride (such as TiN, TaN and CuN), metal (such as copper, platinum, silver, ruthenium and nickel) or other suitable materials, which is not limited herein.

Figure 2:
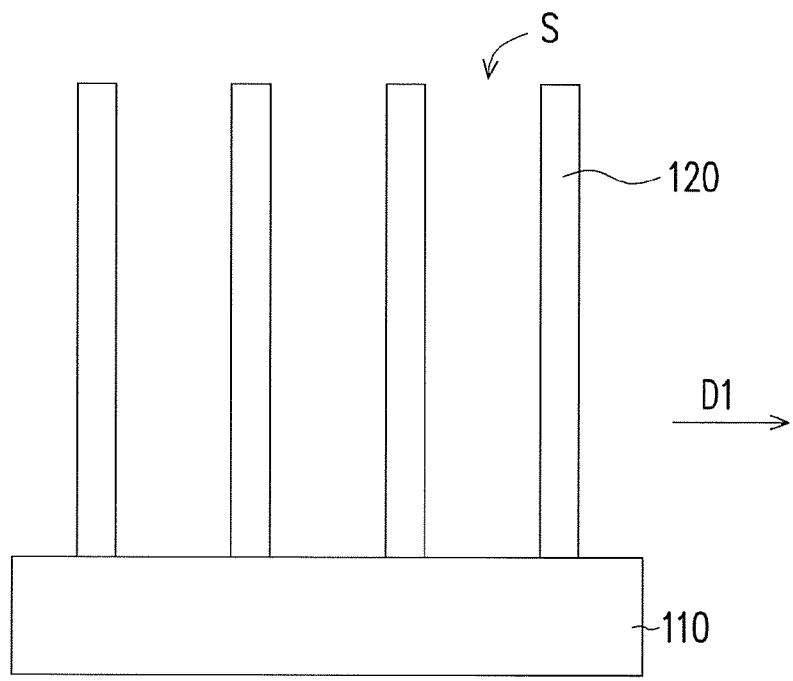

Retelling to FIG. 2, the substrate 110 is partly exposed by removing a part of the first conducting material layer 120a to form a plurality of first inner electrodes 120. The first inner electrodes 120 are arranged along a first direction D1. Each of the adjacent first inner electrodes 120 have an interval S therebetween. In an embodiment, the first conducting material layer 120a is formed of nitride (for example, TiN) and is etched by using an inductive coupling plasma of CF4 and Ar at a process condition of a power of 700 watts, a voltage of minus 150 volts, a process temperature of 40 degrees and a pressure of 15 millitorr. The proportion of CF4 is 20%. In an embodiment, the first conducting material layer 120a is form of metal (for example, copper) and is etched by using hydrocarbon (for example, methane gas) plasma. The methane gas flow is about 65 stem, the process temperature is about 10 degrees and the pressure is about 20 millitorr. In an embodiment, the way of removing the part of the first conducting material layer 120 is varies according to practical usages, which is not limited herein.

Figure 3:
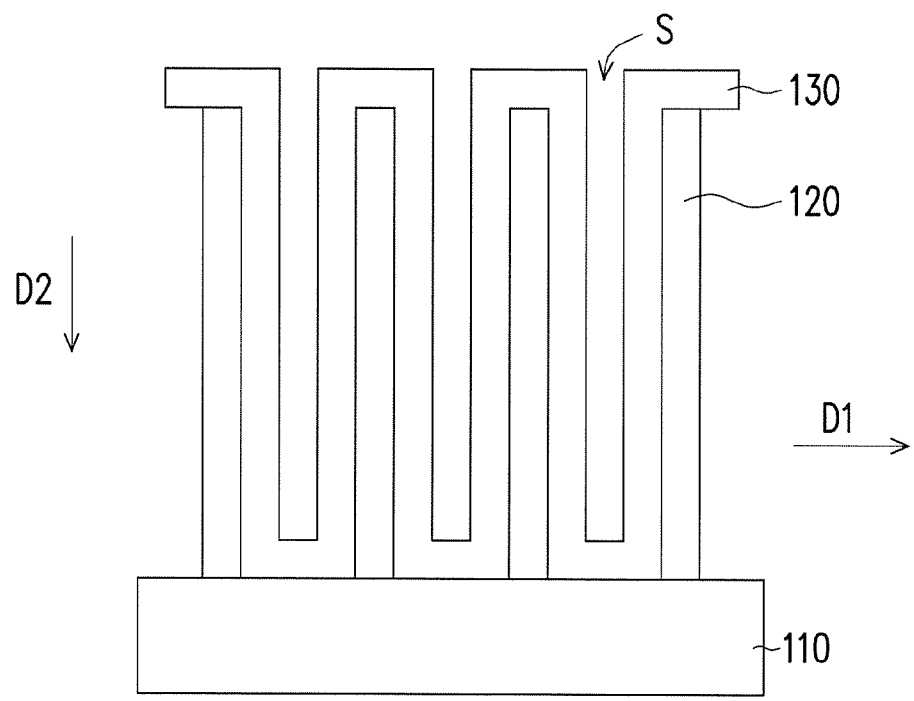

Referring to FIG. 3, a dielectric layer 130 is formed by a chemical vapor deposition such as an atomic layer deposition process along a second direction D2. In the embodiment, the dielectric layer 130 is formed by the atomic layer deposition process. A precursor of the dielectric layer 130 flows alone the second direction D2. In the embodiment, the first direction D1 is perpendicular to the second direction D2. In such a way, the dielectric layer 130 is formed by atomic layer deposition process one time, which simplifies the fabricating process and reduces the cost.

As shown in FIG. 3, the dielectric layer 130 fills in the intervals S and covers the first inner electrodes 120 and the part of the substrate 110, but not fully fills the intervals S. In the embodiment, BaTiO3 (BTO), SrTiO3 (STO) or barium strontium titanate (BST) are stacked to form the dielectric layer 130. In an embodiment, the thickness of the dielectric layer 130 is from 5 nm to 50 mm. In the embodiment, the atomic layer deposition process is conducted under a pressure of 1 torr and a process temperature of 200 degrees to 400 degrees, however, the manufacturing condition of the atomic layer deposition process is adjustable and is not used to limit the disclosure.

Then, a long-range oxygen plasma annealing process or an ion implantation annealing process is performed. In an embodiment, the long-range oxygen plasma annealing process is performed at a pressure of 200 millitorr, a temperature of 250 degrees to 500 degrees. Zr, La, Ce, Co and Mn are used in the ion implantation annealing process in embodiments. In an embodiment, Co and Mn are applied in the ion implantation annealing process at a voltage of 250 kilo electron volts. The ion implantation is conducted at a temperature of 350 degrees and the annealing process is conducted at a temperature of 700 degrees. The manufacturing condition of the long-range oxygen plasma annealing process in embodiments can be changed in practical usage, which is not used to limit the invention.

Figure 4:
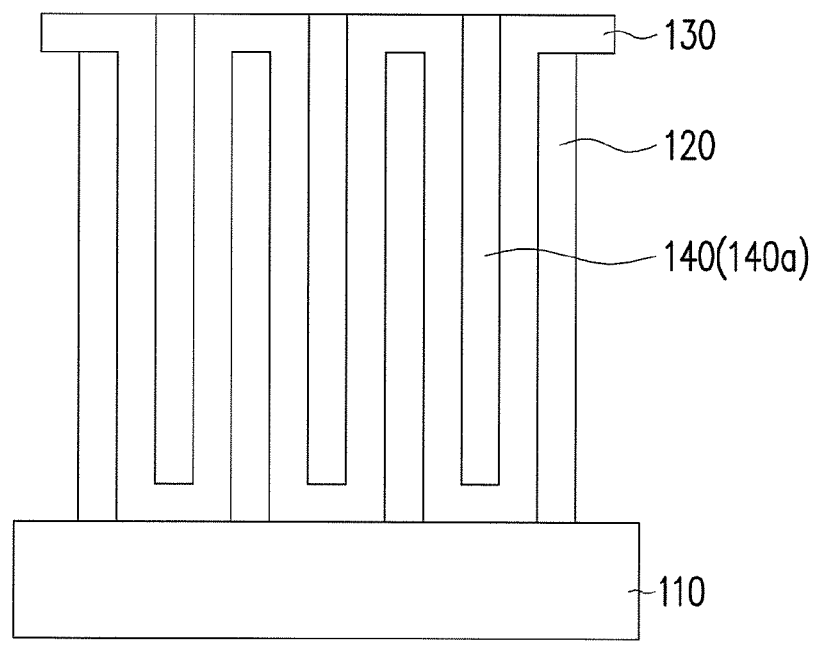

Referring to FIG. 4, a second conducting material layer 140a is formed to fill the intervals S that are not fully filled by the dielectric layer 130 to form a plurality of second inner electrodes 140. In the embodiment, the second conducting material layer 140a is formed also by the atomic layer deposition process. The second conducting material layer 140a is formed of nitride (such as TiN, TaN and CuN), metal (such as copper, platinum, silver, ruthenium and nickel) or other suitable materials, which is not limited herein. In an embodiment, the second conducting material layer 140a is formed of nitride, the atomic layer deposition process is performed at a pressure of 0.01 millitorr to 0.1 millitorr and a process temperature of 300 degrees to 450 degrees. In another embodiment, the second conducting material layer 140a is formed of metal, the atomic layer deposition process is performed at a pressure of 8 millitorr and a process temperature of 375 degrees to 475 degrees. The manufacturing condition in the process is adjusted according to practical requirements, which is not to limit the disclosure.

As shown in FIG. 4, the first inner electrodes 120 and the second inner electrodes 140 are arranged alternatively. The dielectric layer 130 is disposed between the first inner electrodes 120 and the second inner electrodes 140 and covers the surfaces of the first inner electrodes 120 and the second inner electrodes 140.

Figure 5:
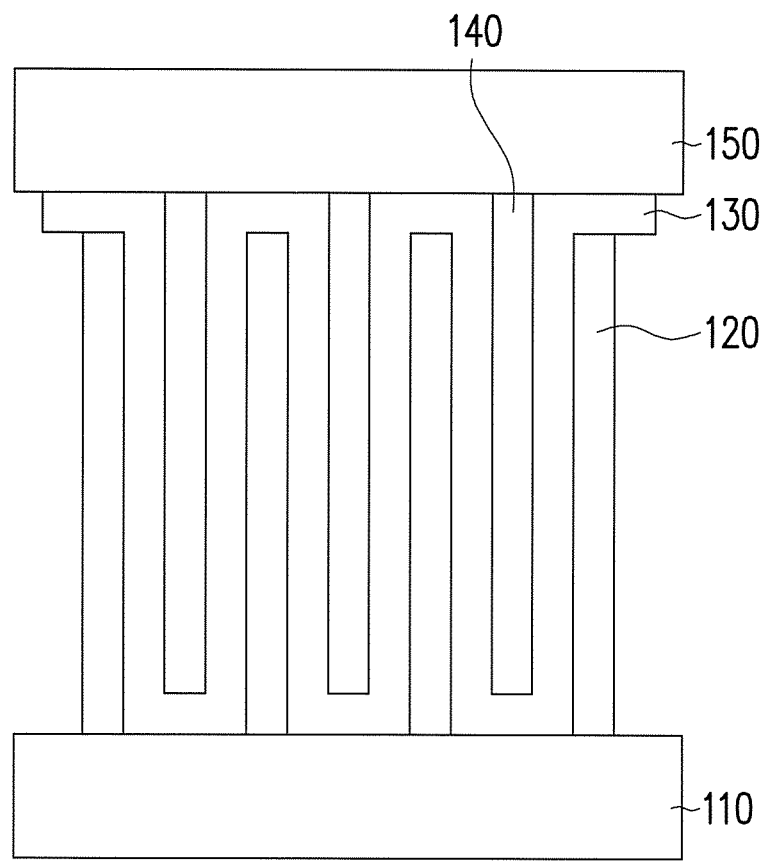

Referring to FIG. 5, the second external electrode 150 is disposed on the second inner electrodes 140. The second external electrode 150 covers a part of the dielectric layer 130 that disposed between the second inner electrodes 140. In such a way, a capacitor 100 is formed. In the embodiment, the second external electrode 150 is formed by a physical vapor deposition (PVD) process. The second external electrode 150 is formed of metal (such as, copper and silver) or other suitable materials, which is not limited herein. In an embodiment, the second external electrode 150 is formed of copper by a sputtering process at a base pressure of $3.1*10^{-6}$ barometric pressure, a working pressure of $3.3*10^{-2}$ barometric pressure and at a process temperature of 300 degrees to 400 degrees. The manufacturing condition in the process is adjusted according to practical requirements, which is not used to limit the disclosure.

Since the dielectric layer 130 of the capacitor 100 is formed on the first inner electrodes 120 by the atomic layer deposition process, the dielectric layer 130 is thin and has a uniform thickness. For example, if the capacitor 100 has a length of 30 mm, a width of 30 mm and a height of 5 mm, in the embodiment, the thickness of the dielectric layer 130 reaches 50 nm, the thickness of the inner electrode reaches 5 nm. When the dielectric layer 130 is formed of BaTiO3 with a dielectric constant of 1500, the capacitance of the capacitor 100 is 43.4 F. Therefore, the volume energy density of the capacitor 100 is 10 times more than that of a conventional supercapacitor. In an embodiment, when the dielectric layer 130 is formed with a thickness of 5 nm, the capacity of the capacitor 100 is increased 100 times. Thus, a thin capacitor with a quick charge characteristic is obtained. The manufacturing condition in the process is adjusted according to practical requirements, which is not to limit the disclosure.

On the other hand, since the first inner electrodes 120 and the second inner electrodes 140 of the capacitor 100 are formed of nitride or metal, the dielectric layer 130 is formed by stacking the barium titanate, the strontium titanate or the barium strontium titanium materials, and the first external electrodes 120 and the second external electrodes 140 are formed of metal, the capacitor can be used at a wider environmental temperature range. In an embodiment, the capacitor 100 is suitable for working under the temperature range of −55° C. to 125° C. Within the temperature range, the capacity variation of the capacitor 100 is kept within 10%, thus the capacitor 100 is capable for working in a rigorous temperature condition.

Since the capacitor 100 has a good capacity performance, heat treatment is saved for raise the dielectric coefficient to increase the capacity of the capacitor 100. Therefore, the usage of the capacity 100 is more flexible and widely applied. Additionally, according to the method for fabricating the capacitor in the above embodiments, the multiple layers of the capacitor 100 can be stacked at one time. The capacity of the capacitor 100 is large enough to serve as a battery, therefore the capacitor 100 in the embodiment is also called as a multi-layer ceramic battery (MLCB).

In sum, according to the method for fabricating the capacitor, the dielectric layer is formed by the atomic layer deposition process to be thin and uniform in thickness. Thus, the capacitor is thin in size and has a quick charge characteristic. Furthermore, in the embodiment, since the first inner electrodes and the second inner electrodes of the capacitor are formed of nitride or metal, the dielectric layer is formed by stacking the barium titanate, the strontium titanate or the barium strontium titanium materials and the first external electrodes and the second external electrodes are formed of metal, the capacitor can be used at a wider environmental temperature range and is able to be used under a rigorous temperature condition.

Although the invention includes been disclosed with reference to certain embodiments thereof, the disclosure is not for limiting the scope. Persons having ordinary skill in the art may make various modifications and changes without departing from the scope of the invention. Therefore, the scope of the appended claims should not be limited to the description of the embodiments described above.

What is claimed is:

1. A method for fabricating a capacitor comprising:
   providing a substrate and a first conducting material layer, wherein the first conducting material layer is disposed on the substrate;
   removing a part of the first conducting material layer to expose a part of the substrate to form a plurality of physically separated first inner electrodes, wherein the physically separated first inner electrodes are arranged along a first direction, and the adjacent physically separated first inner electrodes have an interval therebetween;
   forming a dielectric layer along a second direction by a chemical vapor deposition process immediately after forming the physically separated first inner electrodes, wherein the first direction is perpendicular to the second direction so that the dielectric layer covers the physically separated first inner electrodes, a part of the intervals, and the exposed part of the substrate; and
   forming a second conducting material layer to fill another part of the intervals to form a plurality of second inner electrodes.

2. The method for fabricating the capacitor according to claim 1, wherein the substrate is a first external electrode.

3. The method for fabricating the capacitor according to claim 1, wherein the second conducting material layer is formed by an atomic layer deposition process.

4. The method for fabricating the capacitor according to claim 1, wherein the first conducting material layer and the second conducting material layer are formed of nitride or metal.

5. The method for fabricating the capacitor according to claim 1, wherein the dielectric layer is formed of BaTiO3 (BTO), SrTiO3 (STO) or barium strontium titanate (BST) materials.

6. The method for fabricating the capacitor according to claim 1, further comprising:
forming a second external electrode on the second inner electrode.

7. The method for fabricating the capacitor according to claim 6, wherein the second external electrode is formed by a physical vapor deposition process.

8. The method for fabricating the capacitor according to claim 6, wherein the second external electrode is formed of metal.

9. The method for fabricating the capacitor according to claim 1, wherein the dielectric layer has a thickness of 5 nm to 50 nm.

10. A method for fabricating a capacitor comprising:

providing a substrate and a first conducting material layer, wherein the first conducting material layer is disposed on the substrate;

removing a part of the first conducting material layer to expose a part of the substrate to form a plurality of first inner electrodes in one process step by adopting a single process of dry etching, wherein the first inner electrodes are arranged along a first direction, and the adjacent first inner electrodes have an interval therebetween;

forming a dielectric layer along a second direction by a chemical vapor deposition process, wherein the first direction is perpendicular to the second direction so that the dielectric layer covers the first inner electrodes, a part of the intervals, and the exposed part of the substrate; and forming a second conducting material layer to fill another part of the intervals to form a plurality of second inner electrodes.

* * * * *